United States Patent [19]

Sasano et al.

[11] 4,412,236

[45] Oct. 25, 1983

[54] COLOR SOLID-STATE IMAGER

[75] Inventors: Akira Sasano; Toshio Nakano, both of Tokyo; Ken Tsutsui, Hachioji; Michiaki Hashimoto, Yono; Tadao Kaneko; Norio Koike, both of Tokyo; Akiya Izumi, Mobara, all of Japan

[73] Assignee: Hitachi, Ltd., Tokyo, Japan

[21] Appl. No.: 180,042

[22] Filed: Aug. 21, 1980

[30] Foreign Application Priority Data

Aug. 24, 1979 [JP] Japan .................... 54/107262
Oct. 3, 1979 [JP] Japan .................... 54/126844

[51] Int. Cl.³ .................... H01L 27/14; H01L 29/78; H01L 27/02
[52] U.S. Cl. .................... 357/31; 357/30; 357/24; 357/41
[58] Field of Search .................... 357/41, 30, 31, 32, 357/45, 24 LR

[56] References Cited

U.S. PATENT DOCUMENTS

| 3,969,751 | 7/1976 | Dnakaroff et al. | 357/300 R |
| 4,001,878 | 1/1977 | Weimer | 357/31 X |
| 4,078,243 | 3/1978 | DeBan et al. | 357/320 R |
| 4,242,599 | 12/1980 | Suzuki | 357/24 LR X |
| 4,267,469 | 5/1981 | Ohba et al. | 357/30 X |
| 4,354,104 | 10/1982 | Chikamura et al. | 357/30 X |
| 4,360,821 | 11/1982 | Tsukada et al. | 357/30 X |

OTHER PUBLICATIONS

P. L. P. Dillon et al., "Integral Color Filter Arrays for Solid State Imagers", *Technical Digest 1976 International Electron Devices Meeting*, Dec. 6-8, 1976, pp. 400-403.

*Primary Examiner*—James W. Davie
*Assistant Examiner*—J. Carroll
*Attorney, Agent, or Firm*—Antonelli, Terry & Wands

[57] ABSTRACT

A color solid-state imager comprising a semiconductor body which has a photoelectric conversion function and which includes at least photosensitive elements and switching elements, and predetermined color filters which are formed on the body; characterized in that a light absorbing layer is disposed at least over a vicinity of an output terminal of each switching element. The contours of the color filters can be accurately formed, and unnecessary light can be intercepted to stabilize the electrical characteristics of the solid-state imager.

16 Claims, 9 Drawing Figures

COLOR SOLID-STATE IMAGER

BACKGROUND OF THE INVENTION

1. Field of the Invention

This invention relates to a color solid-state imager.

2. Description of the Prior Art

Recently, the demand for television cameras which are small in size, light in weight and easy of use has risen with the spread of VTRs for industrial or domestic use. Therefore, a solid-state television camera employing a semiconductor integrated circuit (usually, IC or LSI) has attracted attention. In the solid-state television camera, a faceplate and an electron beam generating portion in a conventional image pickup tube are replaced with an IC body, which forms an independent solid-state imager. The solid-state television camera does not use any electron beam and is therefore superior to the image pickup tube in points of high stability, low power dissipation, convenient handling etc., and it is expected as a television camera in the coming generation.

The solid-state imager is formed in the shape of a layer, and consists of a semiconductor substrate portion and a color filter portion. Metal interconnections and insulating protective films are formed on the semiconductor substrate. Ordinarily, therefore, the surface of the semiconductor substrate is not flat but is uneven. According to the inventor's experiment, when a color filter was formed in such a way that a thin film of a photosensitive organic material was formed on a substrate having such an uneven surface and then exposed to light, the ultraviolet rays for the exposure were diffracted at the marginal edge of an exposure mask to lead to the surface of the substrate and were reflected by Al interconnections etc. to cause other parts than the mask to sense the light and to give rise to the so-called problem of "fogging". This resulted in the disadvantage that a pattern whose contour was clear and accurate was not formed.

An example in which a filter is formed directly on a semiconductor substrate having a photosensor portion is disclosed in "Technical Digest of International Electron Device Meeting", December 1976, p. 400.

SUMMARY OF THE INVENTION

An object of this invention is to provide a color solid-state imager which eliminates the above-mentioned disadvantage and which includes a color filter of good optical and electrical characteristics.

Another object of this invention is to provide a color solid-state imager which includes a color filter that can be formed into an accurate pattern.

Still another object of this invention is to provide a color solid-state imager which facilitates the formation of a color filter in an accurate shape.

The essential point of this invention consists in that, on a semiconductor substrate for a solid-state imager having at least a light receiving region and a switching element for taking out as an electric signal carriers generated in the light receiving region, a light absorbing layer (hereinafter referred to as a "shading layer") typified by a black filter is arranged in correspondence with, at least, an output end region of the switching element, a color filter being disposed over the shading layer.

In this case, when the shading layer is formed in correspondence with a marginal edge portion in which the color filter is disposed, it is in effect possible to cover the output end region of the switching element with the shading layer.

Since this invention is constructed as described above, harmful or unnecessary light as otherwise causes the fogging at an exposure in the formation of the color filter is absorbed by the black filter, and the marginal edge of the color filter is not affected by the harmful or unnecessary light at all. It is accordingly possible to form a color filter whose contour is accurately defined. More specifically, even in a case where a color filter is formed by the exposure to, for example, ultraviolet rays, the light diffracted from an end part of a predetermined mask pattern and falling on a predetermined area is absorbed by the black filter and can be thus prevented from reaching the surface of the substrate. Even when, at the exposure, the light reflected from the substrate surface having uneven parts due to Al interconnections etc. exists by any cause, the light to reach an area other than the desired area is intercepted by the black filter in advance and does not cause a photosensitive resin for photoresist to sense the light from the rear thereof. In this manner, the color filter of the accurate pattern can be formed.

Further, in a case where an image is picked up by the use of the imager formed, the black filter intercepts light which falls on a part other than a light receiving region in a light receiving portion, as in the case of the exposure. Therefore, hole-electron pairs are not generated in an unnecessary region irrelevant to light reception, and an increase in leakage current can be perfectly prevented, so that pictures of good quality with stable electrical characteristics can be provided.

DETAILED DESCRIPTION OF THE PREFERRED EMBODIMENTS

Hereunder, this invention will be described in detail in connection with actual examples.

Figure 1:
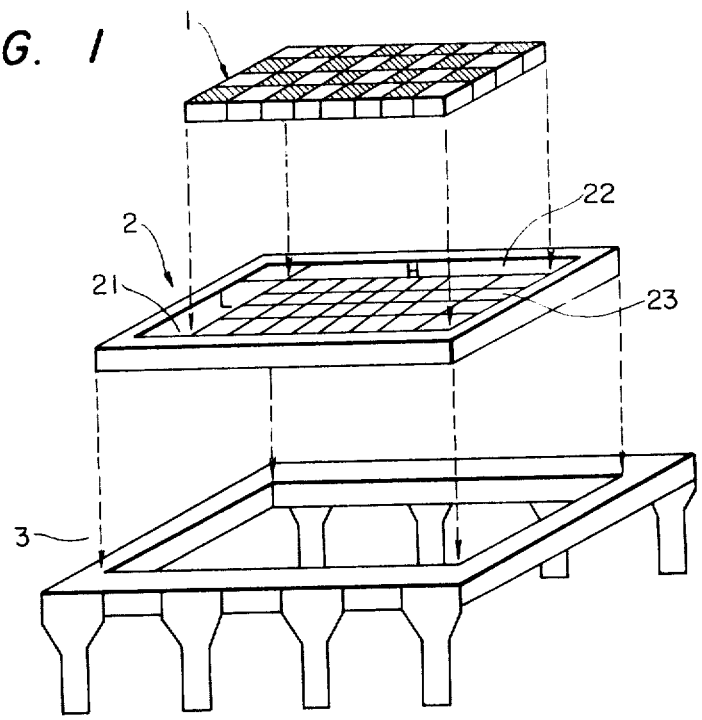
FIG. 1 is a view for explaining the packaged state of a color solid-state imager according to this invention.

FIG. 1 is a schematic constructional view of a package which employs a color solid-state imager of this invention. A semiconductor 2 which includes a vertical scanner region 21, a horizontal scanner region 22 and a photosensor region 23 having a matrix-like layout is fitted in a package frame 3 which has predetermined pin legs. Further, a color filter 1 having a predetermined pattern is formed on the semiconductor body. The figure is depicted as if the color filter and the semiconductor body were separately formed and were thereafter combined. In actuality, however, the color filter is formed unitarily on the semiconductor body. This will become apparent from description to be made later.

Light having entered from an imaging lens (not shown) is subjected to color separation by the color timing signal counter TC provided for other purposes. The central processor unit CU generates a signal SA which assumes a high level at all times during a display mode of operation and assumes a low level during an arithmetic calculation mode of operation. The signal SA is supplied to one terminal of each of the keys via OR gates Oo of which the remaining inputs receive the outputs of the timing signal counter TC. As stated earlier, the signal SA assumes a high level because Ko is HIGH, a flip-flop Fo initially placed into the reset state and SA' is HIGH. Therefore, if a specific key is operated, commonly connected terminals KC of the keys are at the high level so that the flip flop Fo is switched to the set state and the counter TC starts counting and generating the timing signals TC in the order of $T_1$, $T_2$, .... Under these circumstances, the timing signal associated with the specific key is developed at Kc if that timing signal is reached in the sequence of the timing signals. This causes its associated AND gate Ao to be turned ON. The identity of that operated key is provided by identifying which of the AND gates present are in the ON state. The output of Ao is transferred into the processor unit CU. In response to any Ao in the ON state, the processor unit CU provides the signal Ko and resets the flip flop Fo. An AND gate $A_1$ prevents the succeeding generation of SA and inhibits the counter TC to operate.

Whether any key is depressed is checked by Kc. In other words, Kc always assumes a low level when no key is depressed, and changes from the low lever to a high level when a key is depressed. Such change in Kc is sensed by a mono-multivibrator M which is turn provides a signal MS of a given width $t_o$.

Of course, Kc is changed from LOW to HIGH upon development of the next succeeding timing signals. Since the output MS of the mono-multivibrator M is long enough for the operator to hear it provided that it is in the form of an acoustic signal, variations in the input to the multivibrator M within the period $t_o$ have no influence on the operation of the multivibrator M.

The output of the multivibrator is a signal having a fixed period of time starting with depression of the keys. When a sound generating means requires a frequency signal of for example 500 Hz-6 KHZ, an oscillator CG should provide such frequency signal which in turn is applied to an AND gate $A_2$ for the purposes of generating a sound generating signal Po.

Figure 2:
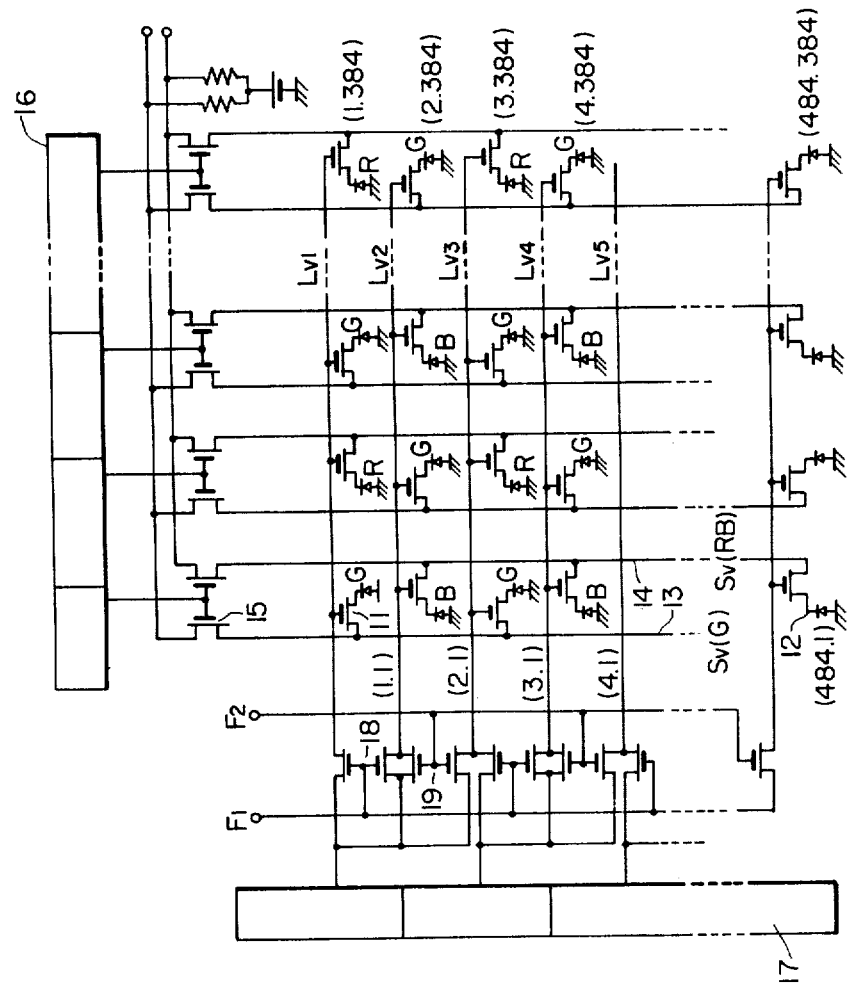
FIG. 2 is a schematic diagram of a circuit arrangement employed in a color solid-state imager.

Referring to FIG. 2, various states of the electronic calculator desired to be alarmed acoustically are described. The sound generating signal Po is created in a generator 6 in response to the timing signal generated from the processor unit 4. When it is generated to make alarm sounds, a signal SA' indicative of an arithmetic operation mode or a key entry mode is supplied via a gate $O_1$ to a gate $A_3$ which then supplies a signal Po to the sound generator 7. The sound generator 7 may be a speaker or a piezo-electro acoustic element. The latter is commercially available, for example, EFB-S46C04 manufactured by Matsushita Electric Industrial Co. of Japan, which comprises a thin plate of metal and a layer of PCM piezo-electro ceramics adhered onto the metal plate.

An error signal E and a key input signal KC are applied to a gate $A_4$. Since with such an arrangement illustrated in FIG. 3 any key input other than that from a clear key is not supplied to the processor unit CU in the presence of an error E incurred within the calculator, KC is kept HIGH such that the generator 7 continues generating an acoustic signal until the clear key is depressed. In other words, the generator 7 goes on generating an acoustic signal during a period from depression of any keys other than the clear key through the release thereof.

A start signal SE sets the flip flop $F_1$ and starts operation of the cunter CC whereas a counting end signal So resets the flip flop $F_1$. In this case the output of the flip flop $F_1$ extends for a given period of time and, therefore, an acoustic sound signal can be provided for the same period of time as that of the output of the flipflop $F_1$ provided that the output is supplied via a loop including $O_1$, $A_3$ and 7.

A reset output of the flip flop $F_1$ may be used for this purpose, although not shown.

Figure 4:
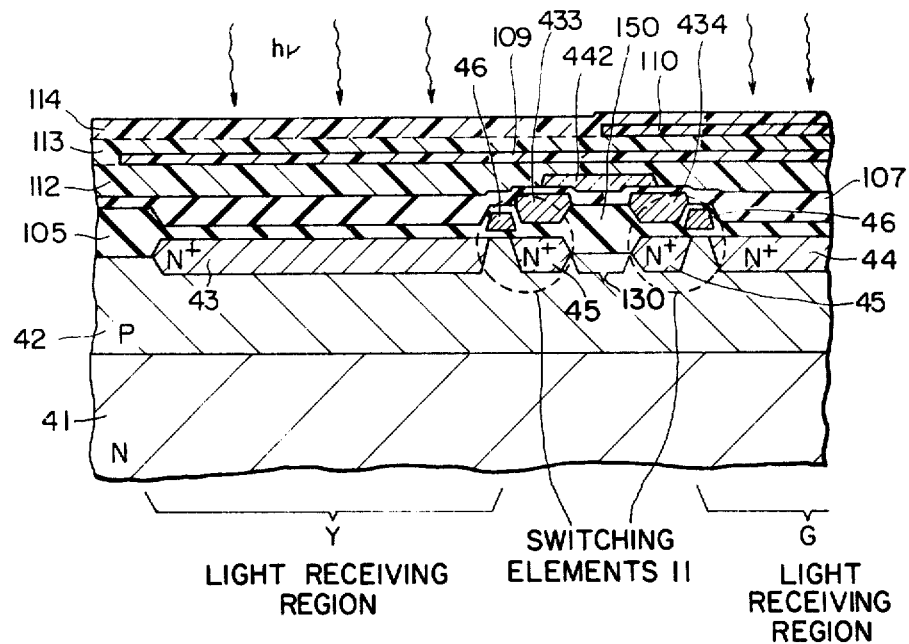
FIG. 4 is a sectional view of the essential portions corresponding to FIG. 3.

FIG. 4 shows a circuit arrangement effective to optionally reset the sound generator 7. A switch F is provided to excite a T type flip flop T which turns OFF an AND gate $A_5$ when in the reset state. Accordingly, the signal Po is not sent to the sound generator or speaker 7. Alternatively, when an earphone Y is placed into a plug-in receptable SWP, the output of $A_5$ is isolated from the sound generator 7 but transmitted into the earphone Y.

Upon removal of the earphone $A_5$ is connected to the speaker 7. The designation $O_1$ is similar to $O_1$ of FIG. 2.

Meritorious effects of the present invention are expected in the following aspects of operation of an electronic calculator.

1. Recent calculators have been adapted to suppress a visual display while performing arithmetic operations, or to provide a visual display each time each of steps of arithmetic operations is terminated. More particularly, in case where functional calculators, program calculators, etc., need much time to effect arithmetic operations, the operator can make sure whether the calculator is in the arithmetic operation mode or the key entry mode, without viewing a digital display provided in the calculator.

2. In the past, in case when a calculator stands in the erroneous state, the operator was informed of such state visually or acoustically at all times when the calculator is in the erroneous state. In the event that the operator pushes any key inadvertently despite the erroneous state it is extremely difficult to determine a point in time where such erroneous state has occurred. Nevertheless, such erroneous state can be recognized easily provided that the acoustic signal is derived only when any key is depressed after the erroneous state has occurred as taught by the present invention.

3. As a rule, a calculator has the automatic cleaning function which starts when power is provided. The operator sometimes operates digit keys or function keys before the calculator not automatically cleared. However, in accordance with the present invention, the acoustic signal is derived only when the calculator is being automatically cleared, thereby indicating the operator is not to operate any keys at this time.

4. In accordance with the present invention, an acoustic sound signal indicative of the arithmetic operation mode can be selected to be much longer than that indicative of the key entry mode. Therefore, when the calculator is being processed in the arithmetic operation mode, a longer audible sound will distinguish between this mode and the normal sound signal indicative of actual depression of any keys.

5. When the surrounding environment atmosphere is quiet, the operator can use an earphone.

light receiving regions correspond to, for example, the light receiving region for yellow (shown by region 43 in FIG. 4), the light receiving region for green (shown by region 44 in FIG. 4) and the light receiving region for cyan (not shown in FIG. 4). Of course, they may well be light receiving regions for the three primary colors of red, blue and green.

Figure 3:
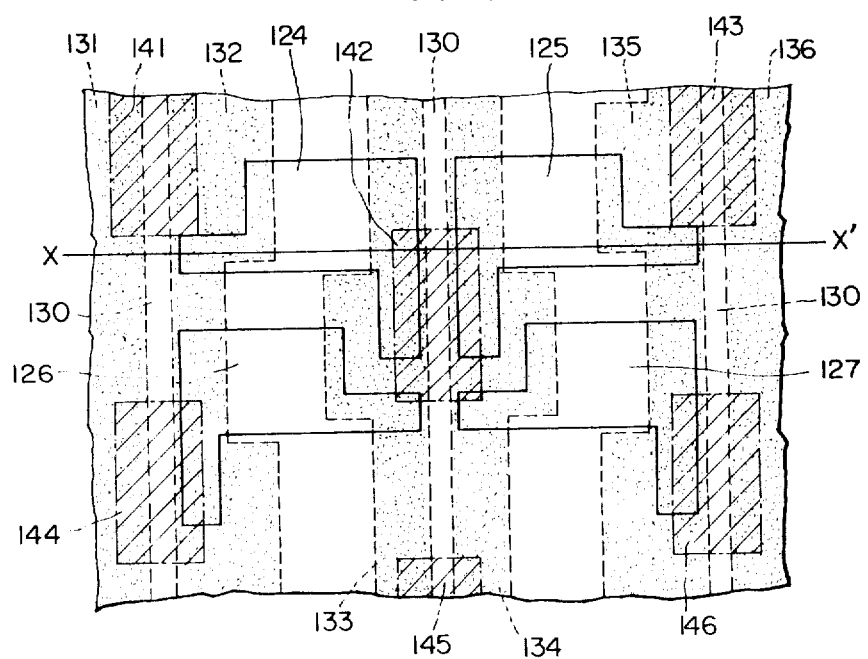
FIG. 3 is a plan view of the essential portions of the color solid-state imager in FIG. 2.

The region 124 in FIG. 3 is the light receiving region for, e.g., yellow and corresponds to the region 43 in FIG. 4. The region 125 in FIG. 3 is the light receiving region for, e.g. green and corresponds to the region 44 in FIG. 4. As shown in FIG. 4, at one of the peripheral edges of each of the light receiving regions 43 and 44, MOS transistors are formed as switching elements 11 by using the light receiving region regions 43 and 44 also as drain regions along with a polycrystalline Si gate electrode 46 between these drain regions and a source regions 45 are formed as switching elements. An SiO₂ oxide film 105 is formed on the light receiving regions 43 and 44 and the P-conductivity type region 42. As stated before, Al interconnections such as 433 and 434 are formed over a part of the non-light receiving region or the switching elements 11 formed as described above. The oxide film 105 and the Al interconnection are covered with an insulating protective film 107 made of SiO₂ layer.

In this manner, the N+ diffused layer of as shown in FIG. 4 the light receiving region 43 is integrated in the P-conductivity type layer formed on the N-type substrate 41, as the N+ layer for the photodiode. Owing to this N+-P-N structure, the spectral sensitivity increases, and the occurrence of causes for deteriorating pictures such as blooming is eliminated. The details of FIG. 4 as a specific embodiment of the invention will be discussed further hereinafter after the following discussion pertaining to the shading layers 141-146 shown in FIG. 3.

The color solid-state imager of this invention is characterized in that each shading layer 442 is arranged on the semiconductor body 41 as follows:

(1) The shading layer 442 is disposed on the semiconductor body 41 formed with a semiconductor integrated circuit including the light receiving region 43 (44), and is overlaid with a desired color filter element 109, 110.

(2) It is essential that the shading layer 442 covers at least the interspace 130 between the first photosensitive region 43 and the second photosensitive region 44 adjacent thereto.

Further, a construction to be stated below brings forth a great merit in practical use. Since the shading layer 442 does not transmit light to a part where no light is required, it prevents the generation of unnecessary photo-carriers within the silicon substrate 41. Especially, unnecessary photo-carriers generated in the output end region of the switching element 11 are included in an output as noise, and they affect characteristics very greatly. It is accordingly preferable that the shading layer covers the interspace 130 between the first photosensitive region 43 and the adjoining second photosensitive region 44 and overlies at least the output end region of the switching element 11. Thus, the arrangement of the shading layers 442 of small area as shown by way of example in FIG. 3 can achieve this object.

Figure 5A:
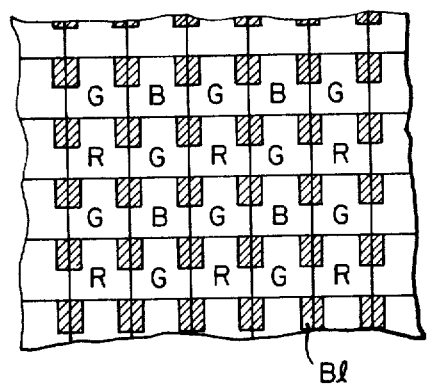
FIGS. 5a to 5c are views for explaining the plan arrangements of shading layers.
Figure 5B:
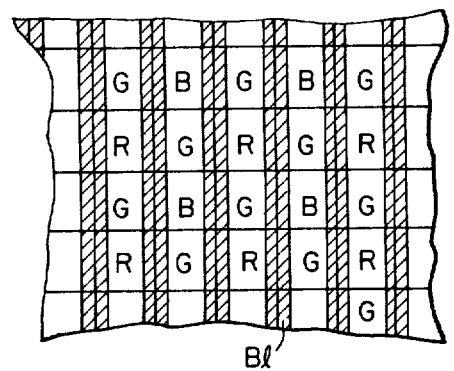

It is also possible to dispose shading layers 442 in the shape of stripes as shown at Bl in FIG. 5b by way of example. However, the arrayal of the shading layers 141-147 exemplified in FIG. 3 is as shown at Bl in FIG. 5a. The arrangement of shading layers 141-147 can be variously modified in correspondence with designs.

Figure 5C:
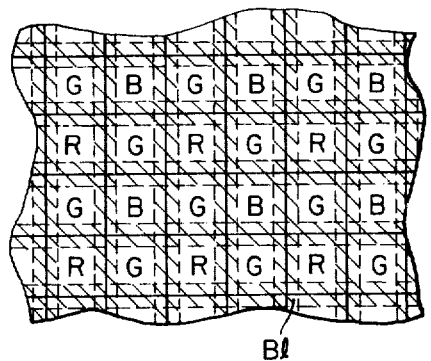

FIGS. 5a-5c exemplify how the shading layers Bl (which correspond to shading layers 141-147 in FIG. 3 and 442 in FIG. 4) are disposed. FIG. 5a shows the example wherein the shading layers Bl of small area are properly arranged, FIG. 5b the example wherein the shading layers Bl in the shape of strips are arranged, and FIG. 5c an example wherein the shading layers Bl are arranged in parallel crosses. In all cases, the shading layer Bl needs to overlie at least the output end region of the switching element 11.

In general, an organic material such as gelatine is employed for the shading layers Bl. In this case, the shading layers are disposed as very fine strips each having, for example, a width of 3-6 μm and a length of about 6-7 mm. Such shading layers have the disadvantage that the strips are liable to damage due to the shrinkage of gelatine. This disadvantage can be eliminated in such a way that, as shown in FIG. 5a, the shading layers are arranged in the configuration in which the strips are split into small areas.

It is more favorable that the black filters used as the shading layers are arranged in parallel crosses as shown in FIG. 5c. However, they are not always restricted to this shape in some arrangements of the Al interconnections etc. They may, at need, be in the shape of stripes which extend in the vertical direction only or be in a spotted pattern in which they are formed so as to cover only uneven surfaces being the most liable to reflect light, as long as they protect substantially the marginal edges of the color filter elements from harmful light. In other words, particular geometrical shapes are not especially rigidly adhered to.

Embodiments:

A semiconductor body which has predetermined light receiving regions and a semiconductor integrated circuit formed into a predetermined circuit arrangement is prepared. The light receiving regions and the semiconductor integrated circuit portion may be fabricated in accordance with a conventional method of producing a semiconductor device.

Returning now to FIG. 4, a light receiving region 43 as a photosensor is formed in a well 42 provided in an Si substrate 41. Further, an oxide film 105 is formed on the substrate and on light receiving regions 43 and 44. Two Al interconnection layers 433 and 434, each of which has a thickness of 1μ and a width of 3μ and is spaced from the other Al interconnection approximately 4μ, are formed over a non-light receiving region (corresponding to the Si substrate other than the light receiving regions 43 and 44). An insulating protective film 107 which serves as a passivation layer and is made of a silicon dioxide layer (SiO₂) is formed on the oxide film 105 and the Al interconnection layers 433 and 434.

The semiconductor body is coated with gelatine by the rotational application. Here, a warm aqueous solution at 40° C. containing 5% of ammonium dichromate $(NH_4)_2CR_2O_7$ usually abbreviated to ADC) is employed as a hardener. The gelatine coating layer is made about 1μ thick. Subsequently, an exposure to ultraviolet rays is carried out with a Cr mask so as to polymerize and harden the gelatine layer, and a developing treatment is performed. Thus, a dyeable gelatine pattern 442 is formed to serve as the shading layer. The gelatine layer is about 3 μm to 6 μm wide, and about 13 to 14 μm long. Subsequently, a black dyeing liquid obtained by mixing respective dyes of red, yellow and blue is heated to about 70° C., and the above structure is dipped therein, whereby the gelatine layer is dyed black. A 2%-aqueous solution of Diacid 11, which is a trade name for red dye manufactured by Mitsubishi Chemical Industries, Ltd., can be employed as the red dye, a 0.7%-aqueous solution of Kayanol Yellow, which is a trade name for yellow dye manufactured by Nippon Kayaku Co., Ltd., can be used as the yellow dye, and a 2%-aqueous solution of Methyl Blue, which is a trade name for blue dye manufactured by Tokyo Kasei Company, can be used as the blue dye. Of course, other red, yellow and blue dyes could be used if desired.

In this invention, the black dye was formed by mixing color dyes which had generally chromatic colors. However, the colors of red, yellow and blue are not restrictive, but colors of red, green and blue may well be used. The three colors are not restrictive, but dyes of two colors may well be mixed if the combination lowers the transmission factor (of light) sharply. It is also allowed to dye the gelatine layer successively with the respective color dyes. Also, an inherent black dye such as 1%-aqueous solution of Suminol Milling Black, which is a trade name for black dye manufactured by Sumitomo Chemical Co., Ltd., may well be used.

The plan configuration of the shading layers of black is as shown in FIG. 3.

At the next step, a color mixture-preventing transparent protective film 112 made of polyglycidyl methacrylate (abbreviated to PGMA) is formed on the filter element 442 and the insulating protective film 107, and a color filter element 109 made of gelatine and being 1 μm thick is formed in a predetermined pattern in a region corresponding to the light receiving region 43 or 44.

The color filter element 109 is formed as follows. A presensitized photosensitive liquid is uniformly applied on gelatine by the rotational application or the like and is dried to form a photosensitive film. Thereafter, only a predetermined part corresponding to the light receiving regions 43 and 44 is photo-hardened by the mask exposure and is developed to remove the photosensitive film other than the light receiving region part. The predetermined part corresponding to the light receiving regions 43 and 44 is dyed with a dye having predetermined spectral characteristics. Then, the yellow filter element 109 is formed. As the material of the color filter element, besides gelatine described above, polyvinyl alcohol, glue or the like can be used without any difference. Of course, polyinyl alcohol, glue or the like can be used also as the material of the shading layer 442.

At the next step, a color mixture-preventing transparent protective layer 113 (also called "intermediate layer") is applied to the extent of the thickness of the yellow filter element 109 and is solidified. Thereafter, a color filter element 110 of cyan made of gelatine and having a predetermined pattern is formed on the color mixture-preventing protective layer corresponding to the green light receiving region 44. Subsequently, a protective layer 114 is applied to the extent of the thickness of the cyan filter element 110 and is solidified. If necessary, it is also possible to raise the light receiving efficiency by forming an anti-reflection film on the protective layer 114 As is the case with layer 112, layers 113 and 114 can also be formed of PGMA.

In this embodiment, the yellow filter element is arranged for the first color, and the cyan filter element for the seocnd color. Of course, however, the sequence is not always restricted to that in the embodiment. In the present embodiment, the remaining color of magenta among the three primary colors of the complementary system is formed in such a way that a green color signal produced by superposing the yellow and cyan color filter elements is inverted electric circuit-wise. This is economically advantageous because the number of color filter elements may be small. Of course, this invention could provide good color solid-state imagers quite similarly with filters of all the three colors of yellow, magenta and cyan of the complementary system as disposed from the beginning or with filters of the three primary colors of light.

In this way, using the black color filter elements 442, the plurality of color filter elements could be formed into accurate patterns without being affected by the diffraction and the reflected light from the Al interconnections such as 433 and 434 during the exposure, and imagers of good electrical characteristics could be provided.

As stated before, the exposure at the photoetching is executed through the mask pattern. On the other hand, a fixed spacing is usually existent between a predetermined color filter and a substrate. In this invention, however, the black filter is formed between the color filter and the substrate. Therefore, even when the light for the exposure is diffracted through an interspace such as 130 having heretofore been particularly problematic and is irregularly reflected by the uneven substrate surface, it is absorbed by the black filter 442. Accordingly, it is avoided that even the unnecessary area of a photoresist layer in the rear of the photo-mask is caused to sense the light, and an accurate pattern can be formed. In this manner, the parts of the Al interconnections 433 and 434 having heretofore been a great factor for the "fogging", that is, the output terminal parts in the peripheral edge of the color filter in which the Al interconnections are formed, are covered with the black filter element 442 and shielded. As a result, even when the light is diffracted and reflected from the substrate surface, the unnecessary part of the photo-mask is prevented from being exposed to the light, and it becomes possible to form a color filter in an accurate pattern whose contour is clear.

The black filter elements may well be disposed at need in the vertical scanner (V) 17 and horizontal scanner (H) 16, etc. other than the light receiving regions 43 and 44. Since they do not pass the light to the parts other than the photosensor parts which require no light, unnecessary hole-electron pairs are prevented from appearing within the Si substrate. With this measure, no leakage current developed, pictures of good quality could be provided, and the operations of the circuit constituents could be prevented from degrading.

In this way, the fogging ascribable to the uneven surface of the semiconductor body was checked, so that the light transmission characteristics of the color filter could be exploited 100%, and owing to the non-existence of any decrease ascribable to the fogging, color solid-state imagers of high sensitivity could be provided.

It is another advantage of the present invention that it is unnecessary to make picture elements larger in advance in order to compensate for the degrading component of the color filter due to the fogging. Therefore, miniaturization of the picture elements was permitted, the elements could be formed smaller, and the number of the photosensors per unit area could be increased. Accordingly, color solid-state imagers of high resolution could be provided.

Figure 6:
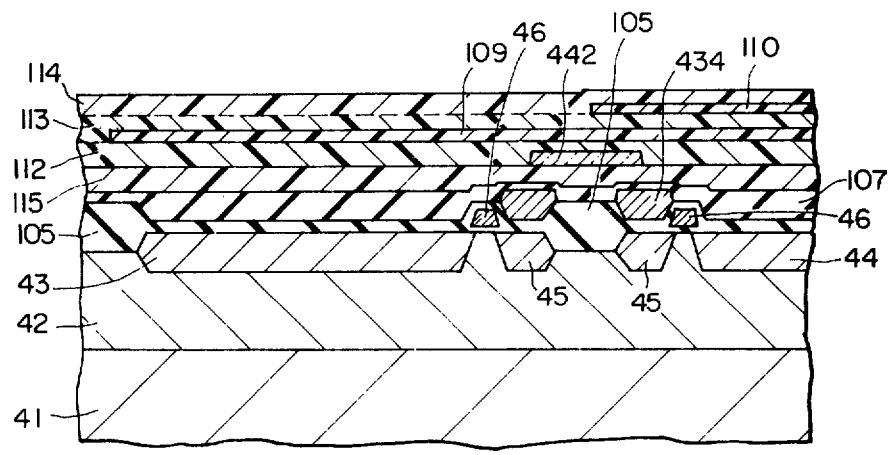
FIGS. 6 and 7 are schematic sectional views of color solid-state imagers which are further embodiments of this invention.

FIG. 6 is a schematic sectional view of a color solid-state imager which is still another embodiment of this invention.

This embodiment is mostly the same as the color solid-state imager described as to the embodiment corresponding to FIG. 4, but it is provided with a transparent high polymer resin film 115 on the insulating protective film 107.

The spectral characteristics of the color filter are greatly influenced by the thickness of the gelatine film used for forming various filters such as 442, 109 and 110. Therefore, when the gelatine film is applied directly on the semiconductor body having an uneven surface, sufficient care needs to be taken of the adjustment of the film thickness within the color filter or between the color filters. In the present embodiment, therefore, the transparent high polymer resin 115 is applied on the semiconductor body uniformly at a thickness between 0.5 and 2.0μ in advance, to moderate the uneven parts and to form a flat surface, whereupon the black filter elements and the color filter elements are formed. With this measure, the control of the thickness of the gelatine film or the thickness of the color filter was facilitated, and the period of the manufacturing process could be shortened. While polymethyl methacrylate (usually abbreviated to PMMA) was employed as the transparent high polymer resin, polyglycidyl methacrylate (PGMA) used for the color mixture-preventing protective film described before can also be employed.

When the color mixture-preventing protective film has a thickness less than ½ of the thickness of the gelatine film, it breaks in the marginal edge of the pattern on account of an insufficient mechanical strength and dyes the underlying gelatine layer. Therefore, a thickness which is at least ½ of the thickness of the gelatine film is required.

Further, when the transparent high polymer resin layer 115 was doped with a light absorbing (i.e. shading) agent in advance, light reflected from the semiconductor body surface was weakened and a still better pattern could be formed. As this transparent high polymer resin, polyglycidyl methacrylate (PGMA) was used. As the light absorptive dopant, an ultraviolet absorbing agent such as 2, 2', 4, 4'-tetrahydroxybenzophenone (THBP) was used. Besides, there can be employed 2,2'-dihydroxybenzophenone, 2-hydroxy-4-methoxybenzophenone, 2(2'-hydroxy-5'-methylphenyl) benzotriazole, etc. In forming the transparent high polymer resin film, it is necessary to apply a solution and thereafter heat and harden it.

Since, as stated above, the transparent high polymer resin layer 115 is formed, the light reflected from the uneven surface of the semiconductor body such as the Al interconnections is mostly absorbed or weakened by the resin layer. Therefore, when the transparent high polymer resin layer is used jointly with the foregoing black filter, the photoresist layer for photoetching formed on the gelatine layer can be formed into a more accurate mask pattern for the filter without causing the other parts than the predetermined pattern to sense the light.

This invention has been revealed to be quite similarly applicable to a solid-state imager wherein on a Si substrate 41 provided with a switching circuit composed of switching elements 11 utilizing PN-junctions, photoconductive thin films of chalcogen glass or the like are formed as photoelectric conversion elements instead of PN-junctions. In the present example, an Se-As-Te film of the P-conductivity type was used as the photoconductive thin film of the solid-state imager. In this device, there are a small number of uneven parts attributed to Al interconnections, but an insulating film and the Si substrate form uneven parts. Since the black filter absorbed the rear exposure light due to the irregular reflection of the exposure light ascribable to these uneven parts, a good color filter could be formed.

Figure 7:
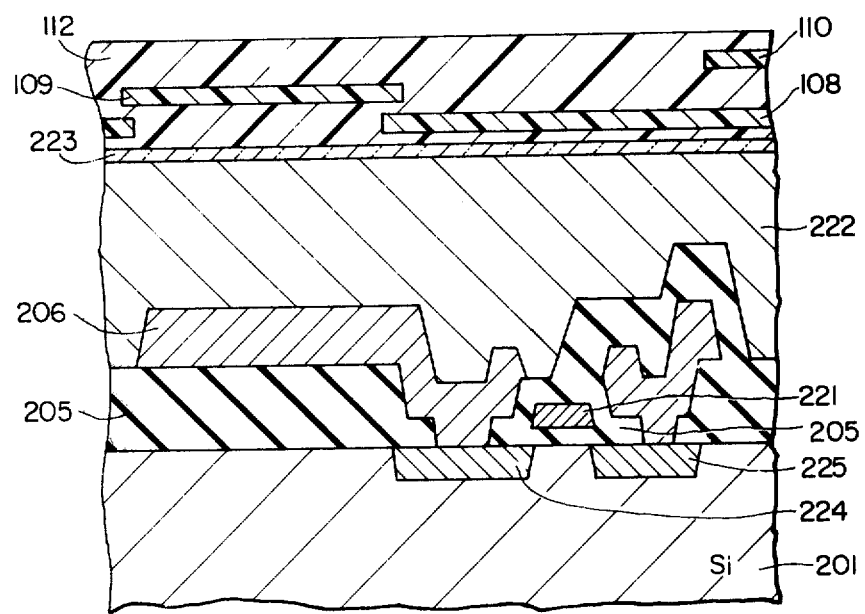

FIG. 7 shows an embodiment of this type. The figure is a sectional view of one picture element portion. This solid-state imager employs a photoconductive thin film as a light receiving portion. Impurity regions 224 and 225 are formed in an Si substrate 201, and a gate electrode 221 overlies them through an insulating film 205. A switching element is thus constructed, and a large number of such switching elements are arranged in plan. The photoconductive thin film 222 is formed on the switching elements, and is overlaid with a transparent electrode 223. These various elements can all be constructed in accordance with known semiconductor techniques and materials. For example, if the substrate 201 is selected to be a P-type silicon, regions 224 and 225 would be diffused with N+ -type impurities and the insulating film 205 could be formed of $SiO_2$. As is also common, a Poly-Si material could be used for the gate electrode 221 and the transparent electrode 223 could be formed of $In_2O_5$. Of course, other appropriate materials could be used if desired.

Numeral 206 designates an electrode which is connected to the source of the vertical MOS switch. As is common, the electrode 206 can be formed of aluminum. The photoconductive thin film 222 is electrically conductive to the electrode 206, but is insulated from the gate electrode 221 through the oxide film 205. The region 224 is a diffused layer for leading out the electrode 206, and corresponds to, e.g., the source of the vertical MOS switch. The electrode 206 forms a capacitance proportional to its area between it and the transparent photoconductive thin film or electrode 223 through the photoconductive thin film 222. This photoconductive thin film 222 is made of a substance exhibiting a photoconductivity such as $Sb_2S_3$, CdS, $As_2Se_3$ and polycrystalline Si. Since the electrode pattern is set in a manner to be split into the shape of a matrix, equivalently such capacitances are arranged in the shape of the matrix. Since the capacitances include the photoconductive thin film therein, they function as photosensors and form picture elements.

On the picture element, the black filter element 108, the color filter elements 109 and 110 etc. are formed by the same method as in the foregoing embodiment. The manufacturing methods and constructions of the respective filters are quite the same as described before, and are not repeated here.

What is claimed is:

1. A color solid-state imager comprising:
   a semiconductor body including a plurality of light receiving regions which each include a photosensor element and a switching element located in a major surface of said semiconductor body, each of said switching elements having an output terminal coupled thereto;
   a color filter formed over said major surface of said semiconductor body to cover said plurality of light receiving regions; and
   a shading layer interposed between said color filter and said major surface of said semiconductor body to cover at least a portion of said output terminals of said switching elements.

2. A color solid-state imager comprising:

a semiconductor body including a plurality of light receiving regions arranged as a matrix in a major surface of said semiconductor body, wherein each light receiving region includes a photosensor element and a switching element;

a plurality of electrical interconnections formed on said major surface of said semiconductor body coupled to said photosensor elements and said switching elements, said electrical interconnections including output terminals coupled to an output region of each of said switching elements;

a color filter formed over said major surface of said semiconductor body to cover at least a portion of said plurality of light receiving regions and a portion of said plurality of electrical interconnections; and a shading layer interposed between said color filter and said electrical interconnections to cover at least a portion of said output terminals for preventing light which is directed toward said major surface of said semiconductor body from reaching said portions of said output terminals covered by said shading layer.

3. A color solid-state imager as defined in claim 1 or 2, wherein said shading layer is disposed at least in correspondence with marginal edge regions of the color filter which are located in the vicinity of said output terminals of said switching elements.

4. A color solid-state imager according to claim 1 or 2, wherein said color filter includes different filter regions for filtering different colors so that different light receiving regions will receive different color light.

5. A color solid-state imager according to claim 1 or 2, wherein said shading layer also covers interspace regions along said major surface of said semiconductor body between said plurality of light receiving regions.

6. A color solid-state imager according to claim 1 or 2, wherein said shading layer is formed as a plurality of shading regions located in a strip pattern on said major surface of said semiconductor body to cover at least said output terminals of said switching elements.

7. A color solid-state imager according to claim 1 or 2, wherein said shading layer is formed as a plurality of shading regions located on said major surface of said semiconductor body in a matrix pattern to cover at least said output terminals of said switching elements.

8. A color solid-state imager according to claim 1 or 2, wherein said shading layer is formed as a plurality of shading regions located on said major surface of said semiconductor body in a pattern of parallel crosses to cover at least said output terminals of said switching elements.

9. A color solid-state imager according to claim 1 or 2, wherein said shading layer comprises a black filter.

10. A color solid-state imager according to claim 1 or 2, wherein a transparent high polymer resin layer is interposed along said major surface of said semiconductor body between said major surface and said shading layer.

11. A color solid-state imager according to claim 10, wherein said high polymer resin layer is doped with an ultraviolet absorbing agent.

12. A color solid-state imager according to claim 10, wherein said high polymer resin layer has a first major surface which faces said major surface of said semiconductor body and a second major surface opposite to said first major surface which second major surface faces said shading layer, wherein said second major surface is substantially flat and further wherein said shading layer is formed with a substantially uniform thickness on said second major surface of said high polymer resin layer.

13. A color solid-state imager according to claim 11, wherein said high polymer resin layer has a first major surface which faces said major surface of said semiconductor body and a second major surface opposite to said first major surface which second major surface faces said shading layer, wherein said second major surface is substantially flat and further wherein said shading layer is formed with a substantially uniform thickness on said second major surface of said high polymer resin layer.

14. A color solid-state imager according to claim 1 or 2, wherein said photosensor elements are photodiodes and said switching elements are MOS transistors.

15. A color solid-state imager according to claim 14, wherein said output terminals are coupled to source regions of said MOS transistors formed in light receiving regions in said major surface of said semiconductor body.

16. A color solid-state imager according to claim 15, wherein said output terminals of said MOS transistors are coupled to a scanning circuit.

* * * * *